(12) United States Patent
Oh et al.

(10) Patent No.: US 9,059,222 B2
(45) Date of Patent: Jun. 16, 2015

(54) WASHING DEVICE AND METHOD FOR FABRICATING THE SAME

(75) Inventors: Tae Young Oh, Gyeonggi-do (KR); Geon Yong Kim, Gyeonggi-do (KR); Eun Ha Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1406 days.

(21) Appl. No.: 12/318,289

(22) Filed: Dec. 24, 2008

(65) Prior Publication Data
US 2010/0071728 A1 Mar. 25, 2010

(30) Foreign Application Priority Data

Sep. 23, 2008 (KR) .................. 10-2008-0093191

(51) Int. Cl.
| | |
|---|---|
| *B08B 3/12* | (2006.01) |
| *H01L 21/677* | (2006.01) |
| *H01L 21/67* | (2006.01) |
| *B08B 3/00* | (2006.01) |

(Continued)

(52) U.S. Cl.
CPC ..... *H01L 21/67051* (2013.01); *H01L 21/02096* (2013.01); *H01L 21/02054* (2013.01); *H01L 21/02057* (2013.01); *H01L 21/0206* (2013.01); *B08B 3/12* (2013.01); *B08B 3/003* (2013.01); *B08B 5/023* (2013.01); *B22F 2998/00* (2013.01)

(58) Field of Classification Search
CPC .......... H01L 21/67051; H01L 21/02096; H01L 21/02054; H01L 21/02057; H01L 21/0206; B08B 3/003; B08B 5/023; B08B 5/043; B08B 1/005; B08B 1/006; B08B 1/04
USPC ......... 134/1, 49–51, 64 R, 115 R; 15/306.1, 15/303, 308, 102
See application file for complete search history.

(56) References Cited

U.S. PATENT DOCUMENTS 5,063,951 A * 11/1991 Bard et al. .................. 134/64 R
5,885,363 A * 3/1999 Nakamura ........................ 134/6
(Continued)

FOREIGN PATENT DOCUMENTS

JP 05333198 A * 12/1993
JP 2000347169 A * 12/2000
(Continued)

OTHER PUBLICATIONS

MPIF, Porous Media Design Guidebook, Jan. 2006 (available at https://web.archive.org/web/20060115000000*/http://www.mpif.org/designcenter/porous.pdf).*

*Primary Examiner* — Joseph L Perrin
*Assistant Examiner* — Kevin G Lee
(74) *Attorney, Agent, or Firm* — Morgan, Lewis & Bockius LLP (57) ABSTRACT

The present invention relates a washing device and a method for fabricating the same which has good chemical resistance and can prevent a scratch from forming on a substrate. The washing device includes a substrate entry guide for making a substrate to enter in a right direction from an outside of the washing device, a foreign matter removal unit for receiving the substrate from the substrate entry guide unit and removing foreign matters from the substrate, a foreign matter washing unit for receiving the substrate from the foreign matter removal unit and washing remained foreign matters from the substrate, and a position control unit for controlling a position of the substrate moving out of the foreign matter washing unit, wherein the substrate entry guide, the foreign matter removal unit, the foreign matter washing unit, and the position control unit are formed of metallic porous material.

11 Claims, 7 Drawing Sheets substrate moving direction (51) Int. Cl.
  *B08B 5/02*    (2006.01)
  *H01L 21/02*   (2006.01)

(56) References Cited

U.S. PATENT DOCUMENTS

2004/0050496 A1    3/2004   Iwai et al.
2006/0219605 A1*  10/2006   Devitt ............................ 209/37
2007/0034228 A1*   2/2007   Devitt ............................ 134/1

FOREIGN PATENT DOCUMENTS

| JP | 2005-325416 A | 11/2005 |
| KR | 10-2005-0111860 A | 11/2005 |
| KR | 10-2005-0025621 A | 3/2006 |

* cited by examiner

WASHING DEVICE AND METHOD FOR FABRICATING THE SAME

This application claims the benefit of the Patent Korean Application No. P2008-093191, filed on Sep. 23, 2008, which is hereby incorporated by reference as if fully set forth herein.

BACKGROUND OF THE INVENTION

1. Field of the Invention

The present invention relates to washing devices, and more particularly, to a washing device and a method for fabricating the same which has good chemical resistance and can prevent a scratch from forming on a substrate.

2. Discussion of the Related Art

A liquid crystal display device controls light transmissivity of liquid crystal cells in response to a video signal for displaying a picture. The liquid crystal display device of active matrix type has a switching device for each of pixel cell, which is favorable for displaying a motion picture. As the switching device, a thin film transistor TFT is mostly used.

The liquid crystal display device is provided with two substrates facing each other, and a liquid crystal layer between the substrates. One of the substrate has thin film transistors like the switching device formed thereon, and the other substrate has a color filter formed thereon. Before and after forming the thin film transistors and the color filter on the substrates respectively, the substrates pass through washing processes, respectively.

A related art processing device used for the washing has low hardness with low chemical resistance, to cause a problem in that the processing device is damaged by washing liquid used for washing.

SUMMARY OF THE INVENTION

Accordingly, the present invention is directed to a washing device and a method for fabricating the same.

An object of the present invention is to provide a washing device and a method for fabricating the same in which a washing device is formed of a metallic porous material having strong chemical resistance for preventing the washing device suffering from damage by washing liquid, and preventing a substrate suffering from damage even if the washing device is brought into contact with the substrate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a washing device includes a substrate entry guide for making a substrate to enter in a right direction from an outside of the washing device, a foreign matter removal unit for receiving the substrate from the substrate entry guide unit and removing foreign matters from the substrate, a foreign matter washing unit for receiving the substrate from the foreign matter removal unit and washing remained foreign matters from the substrate, and a position control unit for controlling a position of the substrate moving out of the foreign matter washing unit, wherein the substrate entry guide, the foreign matter removal unit, the foreign matter washing unit, and the position control unit are formed of metallic porous material.

The substrate entry guide, the foreign matter removal unit, and the foreign matter washing unit are formed of porous materials of metals different from one another.

The substrate entry guide, the foreign matter removal unit, and the foreign matter washing unit are formed of a porous material of one of metals selected from stainless steel, aluminum, an aluminum alloy, brass, hastelloy, and zirconium.

The substrate entry guide, the foreign matter removal unit, and the foreign matter washing unit are formed of porous materials of metals different from one another.

The substrate entry guide includes an entry guide path for guiding the substrate to enter from an outside of the washing device into the foreign matter removal unit accurately, and the entry guide path has a shape in which a width thereof becomes the smaller as the entry guide path is the closer to the foreign matter removal unit.

The substrate entry guide unit includes an upper structure and a lower structure facing, and spaced from, each other to form the entry guide path, wherein the upper structure sprays air toward the entry guide path and draws in the air sprayed thus and the lower structure also sprays air toward the entry guide path and draws in the air sprayed thus so that the substrate entered in the entry guide path floats in the space of the entry guide path, of two facing surfaces of the upper structure and the lower structure, a surface of the upper structure is sloped with respect to an upper surface of the substrate, and a surface of the lower structure is sloped with respect to a lower surface of the substrate, and a space between the two sloped surfaces is the entry guide path.

The upper structure and the lower structure are formed of metallic porous material such that the air supplied from an outside of the washing device passes through the upper structure and the lower structure themselves and is sprayed to the substrate.

The upper structure and the lower structure have a plurality of air suction holes formed therein for drawing in the air, wherein the suction holes in the upper structure is passed through the upper structure and directed toward the entry guide path, and the suction holes in the lower structure is passed through the lower structure and directed toward the entry guide path.

The foreign matter removal unit includes an upper foreign matter removal unit and a lower foreign matter removal unit facing, and spaced from, each other, such that the substrate can pass, wherein the upper foreign matter removal unit removes the foreign matters from the upper surface of the substrate by making physical contact with the foreign matters, and the lower foreign matter removal unit removes the foreign matters from the lower surface of the substrate by making physical contact with the foreign matters.

The upper foreign matter removal unit and the lower foreign matter removal unit are formed of metal.

The upper foreign matter removal unit and the lower foreign matter removal unit vibrate.

The upper foreign matter removal unit moves up/down over the substrate to an extent not to contact to the upper surface of the substrate repeatedly, and the lower foreign matter removal unit moves up/down under the substrate to an extent not to contact to the lower surface of the substrate SUB repeatedly.

The upper foreign matter removal unit moves in front/rear directions, or left/right directions of the upper surface of the substrate in parallel thereto repeatedly, and the lower foreign matter removal unit moves in front/rear directions, or left/right directions of the lower surface of the substrate in parallel thereto repeatedly.

The foreign matter washing unit includes an upper foreign matter washing unit and a lower foreign matter washing unit facing, and spaced from, each other such that the substrate can pass through, wherein the upper foreign matter washing unit sprays air toward the moving space and draws in the air sprayed thus, and the lower foreign matter washing unit sprays air toward the moving space and draws in the air sprayed thus such that the substrate entered in the moving space floats in the space of the moving space, the upper foreign matter washing unit sprays washing liquid toward the moving space to form foam by using the washing liquid and the sprayed air for removing the foreign matters from the upper surface of the substrate passing through the moving space, the lower foreign matter washing unit sprays washing liquid toward the moving space to form foam by using the washing liquid and the sprayed air for removing the foreign matters from the lower surface of the substrate SUB passing through the moving space, and the upper foreign matter washing unit and the lower foreign matter washing unit remove the washing liquid to an outside of the foreign matter washing unit by using the air drawn therein.

The upper foreign matter removal unit and the lower foreign matter removal unit are formed of metallic porous material such that the air supplied from an outside of the washing device passes through the upper foreign matter removal unit and the lower foreign matter removal unit themselves and is sprayed to the moving space.

The upper foreign matter washing unit and the lower foreign matter washing unit includes, a plurality of suction holes formed therein for drawing in the air respectively, and a plurality of spray holes for spraying the washing liquid respectively, wherein the suction holes and spray holes in the upper foreign matter removal unit pass through the upper foreign matter washing unit and are directed toward the moving space, and the suction holes and spray holes in the lower foreign matter removal unit pass through the lower foreign matter washing unit and are directed toward the moving space.

The upper foreign matter washing unit further includes a plurality of trenches wherein the plurality of suction holes are connected to one of the trenches in common for drawing in the air or the washing liquid through the trench and the plurality of spray holes are connected to another one of the trenches in common for spraying the washing liquid through the trench.

The position control unit sprays the air toward an under side of the substrate moving out of the washing device and draws in the air sprayed thus for maintaining the substrate in a floated state.

In another aspect of the present invention, a method for fabricating a washing device comprising a substrate entry guide for making a substrate to enter in a right direction from an outside of the washing device; a foreign matter removal unit for receiving the substrate from the substrate entry guide unit and removing foreign matters from the substrate; a foreign matter washing unit for receiving the substrate from the foreign matter removal unit and washing, remained foreign matters from the substrate; and a position control unit for controlling a position of the substrate moving out of the foreign matter washing unit, wherein the substrate entry guide, the foreign matter removal unit, the foreign matter washing unit, and the position control unit are formed of metallic porous material, the substrate entry guide unit includes an upper structure and a lower structure facing, and spaced from, each other, the foreign matter removal unit includes an upper foreign matter removal unit and a lower foreign matter removal unit facing, and spaced from, each other, the foreign matter washing unit includes an upper foreign matter washing unit and a lower foreign matter washing unit facing, and spaced from, each other, the upper structure and the lower structure, the upper foreign matter washing unit and the lower foreign matter washing unit, and the position control unit include a plurality of elements respectively, the method comprising the steps of providing a mold for molding the element, filling metal powder in the mold, forming the element by applying a pressure to the metal powder in the mold, and forming a plurality of suction holes and spray holes in the element.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
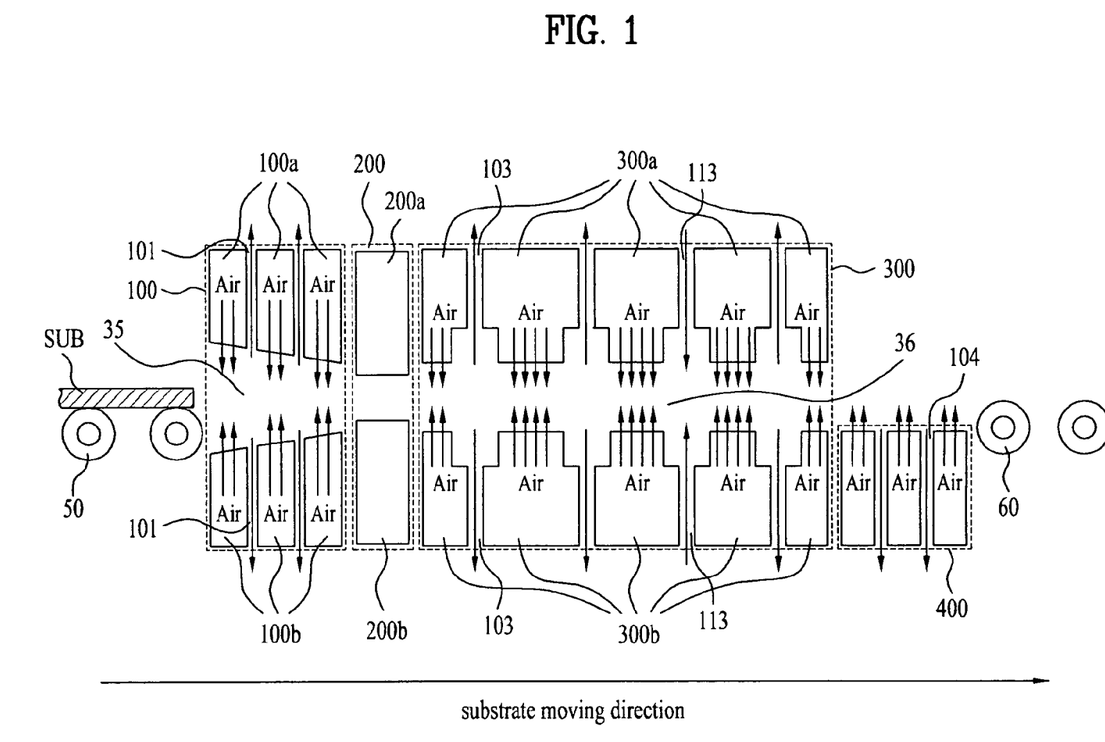
FIG. 1 illustrates a diagram of a washing device in accordance with a preferred embodiment of the present invention.

FIG. 1 illustrates a diagram of a washing device in accordance with a preferred embodiment of the present invention.

Referring to FIG. 1, the washing device includes an entry guide unit 100 for making a substrate SUB to enter in a right direction from an outside of the washing device, a foreign matter removal unit 200 for receiving the substrate SUB from the substrate entry guide unit 100 and removing foreign matters from the substrate SUB, a foreign matter washing unit 300 for receiving the substrate SUB from the foreign matter removal unit 200 and washing remained foreign matters from the substrate SUB, and a position control unit 400 for controlling a position of the substrate SUB moving out of the foreign matter washing unit 300.

The substrate entry guide unit 100, the foreign matter removal unit 200, the foreign matter washing unit 300, and the position control unit 400 are formed of a metallic porous material. For an example, the substrate entry guide unit 100, the foreign matter removal unit 200, and the foreign matter washing unit 300 may be formed of a porous material having a material selected from stainless steel, aluminum, an aluminum alloy, brass, hastelloy, and zirconium.

Moreover, the substrate entry guide unit 100, the foreign matter removal unit 200, the foreign matter washing unit 300, and the position control unit 400 may be formed of a porous material of different metals. For an example, the substrate entry unit 100 may be formed of stainless steel, the foreign matter removal unit 200 may be formed of aluminum, the foreign matter washing unit 300 may be formed of aluminum, and the position control unit 400 may be formed of brass.

Since the stainless steel, aluminum, aluminum alloy, hastelloy, and zirconium have high hardness, the substrate entry guide unit 100, the foreign matter removal unit 200, the foreign matter washing unit 300, and the position control unit 400, formed of above material can enhance chemical resistance of the washing device.

Moreover, since above metals have hardness lower than hardness of the washing object intended to wash, i.e., the substrate, the washing device formed of above metals can prevent the substrate suffering from damage even if the substrate is to come into contact with the washing device.

For an example, the substrate has hardness of 6∞7 mohs, the stainless steel has hardness of 5.5~6.3 mohs, and the aluminum alloy has hardness of 2.4~2.8 mohs.

The above elements will be described in detail.

The substrate entry guide unit 100 includes an entry guide path 35 for guiding the substrate to enter from an outside of the washing device into the foreign matter removal unit 200 accurately by rollers. The entry guide path 35 has a shape in which a width thereof becomes the smaller as the entry guide path 35 is the closer to the foreign matter removal unit 200. The shape of the entry guide path 35 enables the substrate SUB to move toward a center line of the entry guide path 35 automatically even if the substrate SUB is fed to the entry guide path 35 not aligned with the center line.

The entry guide unit 100 includes an upper structure 100a and a lower structure 100b facing each other. The upper structure 100a and the lower structure 100b are spaced a predetermined distance from each other, and the entry guide path 35 is formed in a space between the two structures 100a and 100b spaced thus.

The upper structure 100a sprays air toward the entry guide path 35 and draws in the air sprayed thus. A likely, the lower structure 100a also sprays air toward the entry guide path 35 and draws in the air sprayed thus. According to this, the substrate SUB entered in the entry guide path 35 floats in the space of the entry guide path 35. That is, the upper structure 100a sprays the air toward an upper surface of the substrate SUB entered in the entry guide path 35 and draws in the air sprayed thus, and the lower structure 100b sprays the air toward a lower surface of the substrate SUB entered in the entry guide path 35 and draws in the air sprayed thus, maintaining the substrate SUB in a floated state. In this instance, a spray power is stronger than a drawing in power.

Two facing surfaces of the upper structure 100a and the lower structure 100b are sloped surfaces sloped at a predetermined angle. In detail, the sloped surface of the upper structure 100a is a sloped surface sloped a predetermined angle from the upper surface of the substrate SUB, and the sloped surface of the lower structure 100b is a sloped surface sloped a predetermined angle from the lower surface of the substrate SUB. A space between the two sloped surfaces is the entry guide path 35. The space of the entry guide path 35 can be varied by varying a distance between the upper structure 100a and the lower structure 100b.

In order to make the air supplied from an outside of the washing device to pass through the upper structure 100a and the lower structure 100b themselves and to be sprayed toward the substrate SUB, the upper structure 100a and the lower structure 100b are formed of the metallic porous material. That is, the air sprayed to an upper side of the upper structure 100a from the outside of the washing device passes through the upper structure 100a and is supplied to the entry guide path 35, and the air sprayed to a lower side of the lower structure 100b from the outside of the entry guide unit 100 passes through the lower structure 100b and is supplied to the entry guide path 35.

The upper structure 100a and the lower structure 100b have a plurality of suction holes 101 for drawing in the air, respectively. The suction holes in the upper structure 100a pass through the upper structure 100a and are directed toward the entry guide path 35, and the suction holes in the lower structure 100b pass through the lower structure 100a and are directed toward the entry guide path 35.

The foreign matter removal unit 200 includes an upper foreign matter removal unit 200a and a lower foreign matter removal unit 200b facing each other. The upper foreign matter removal unit 200a and the lower foreign matter removal unit 200b are spaced a predetermined distance from each other, and a space between the two structure spaced thus forms a moving space 36 through which the substrate SUB moves.

The upper foreign matter removal unit 200a removes the foreign matters from the upper surface of the substrate SUB by making physical contact with the foreign matters, and the lower foreign matter removal unit 200a removes the foreign matters from the lower surface of the substrate SUB by making physical contact with the foreign matters.

When the substrate SUB is positioned in a moving space between the upper foreign matter removal unit 200a and the lower foreign matter removal unit 200b, a gap between The upper foreign matter removal unit 200a and the upper surface of the substrate SUB is about 20 μm, and a gap between the lower foreign matter removal unit 200b and the lower surface of the substrate SUB is also about 20 μm. Because the substrate SUB is very close to the upper foreign matter removal unit 200a and the lower foreign matter removal unit 200b thus, the foreign matter projected upward from the upper surface of the substrate SUB is interfered with and removed by the upper foreign matter removal unit 200a when the substrate SUB moves through the moving space 36, and the foreign matter projected downward from the lower surface of the substrate SUB is interfered with and removed by the lower foreign matter removal unit 200b when the substrate SUB moves through the moving space 36. The distance between the upper foreign matter removal unit 200a and the lower foreign matter removal unit 200b can be varied with thickness of the substrate SUB.

The upper foreign matter removal unit 200a and the lower foreign matter removal unit 200b may be formed of a metal or a metallic porous material.

Figure 2:
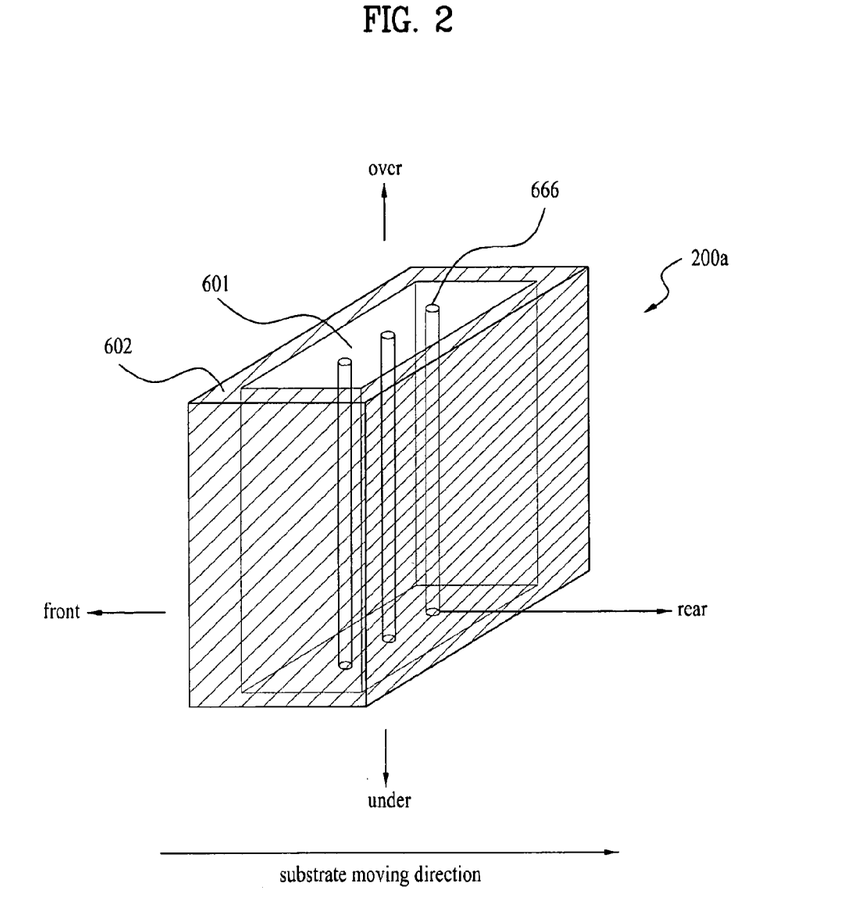
FIG. 2 illustrates a diagram of the upper foreign matter removal unit in FIG. 1 in accordance with another preferred embodiment of the present invention.

As another embodiment, the upper foreign matter removal unit 200a and the lower foreign matter removal unit 200b may have structures as shown in FIG. 2, respectively.

FIG. 2 illustrates a diagram of the upper foreign matter removal unit 200a in FIG. 1 in accordance with another preferred embodiment of the present invention.

Referring to FIG. 2, the upper foreign matter removal unit 200a includes a body 601, and a removal unit 602 on an outer side of the body 601.

The body 601 is formed of a porous material so that the air supplied from the outside passes through the body 601 itself and is sprayed toward the substrate SUB, and the removal unit 602 is on the outer side of the body 601 excluding a surface through which the air is supplied, and a surface through which the air is sprayed. The removal unit 602 is formed of metal, and the body 601 of the upper foreign matter removal unit 200a has a plurality of suction holes 666 for drawing in air from the upper side of the substrate SUB.

Though not shown, referring to FIG. 2, the lower foreign matter removal unit 200b may have a system identical to the upper foreign matter removal unit 200a. That is, the lower foreign matter removal unit 200b also includes a body, a removal unit, and a plurality of suction holes.

The suction holes in the upper foreign matter removal unit 200a and the lower foreign matter removal unit 200b serve to maintain the substrate SUB in a floated state.

The upper foreign matter removal unit 200a and the lower foreign matter removal unit 200b can vibrate. The vibration enables more effective removal of the foreign matters from the substrate SUB.

Referring to FIG. 2, the upper foreign matter removal unit 200a and the lower foreign matter removal unit 200b move up/down, repeatedly. In this instance, the upper foreign matter removal unit 200a moves up/down over the substrate SUB to an extent not to contact to the upper surface of the substrate SUB repeatedly, and the lower foreign matter removal unit 200b moves up/down under the substrate SUB to an extent not to contact to the lower surface of the substrate SUB repeatedly.

Moreover, the upper foreign matter removal unit 200a can move in front/rear directions, or left/right directions of the upper surface of the substrate SUB in parallel thereto repeatedly, and the lower foreign matter removal unit 200b can move in front/rear directions, or left/right directions of the lower surface of the substrate SUB in parallel thereto repeatedly.

Figure 3:
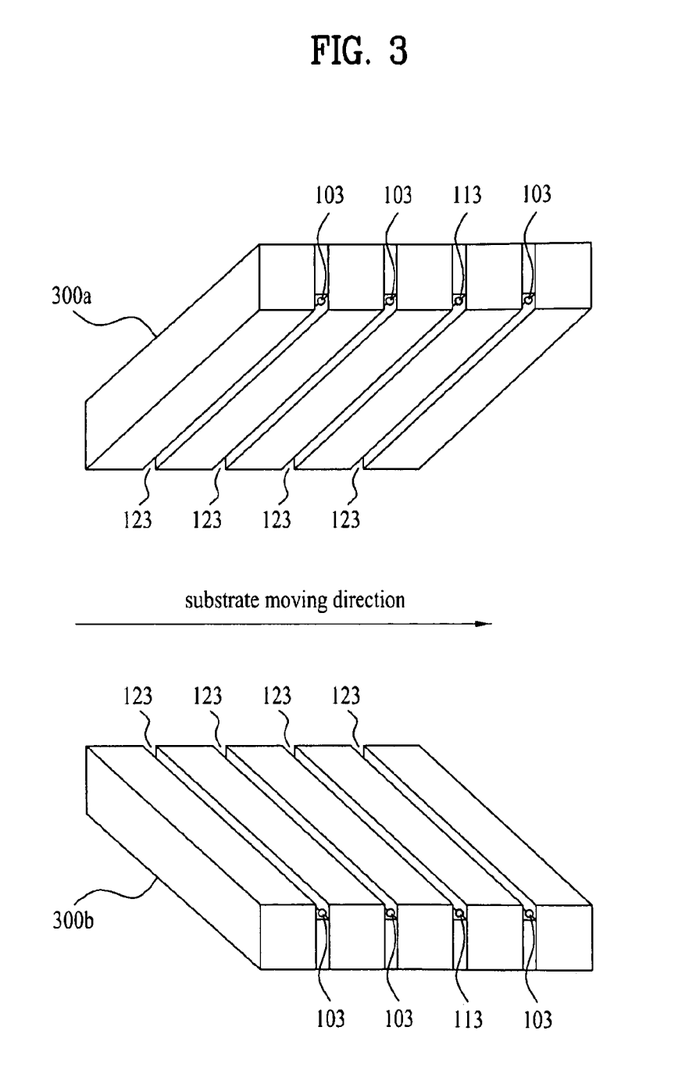
FIG. 3 illustrates a perspective view of the washing unit in FIG. 1.
Figure 4:
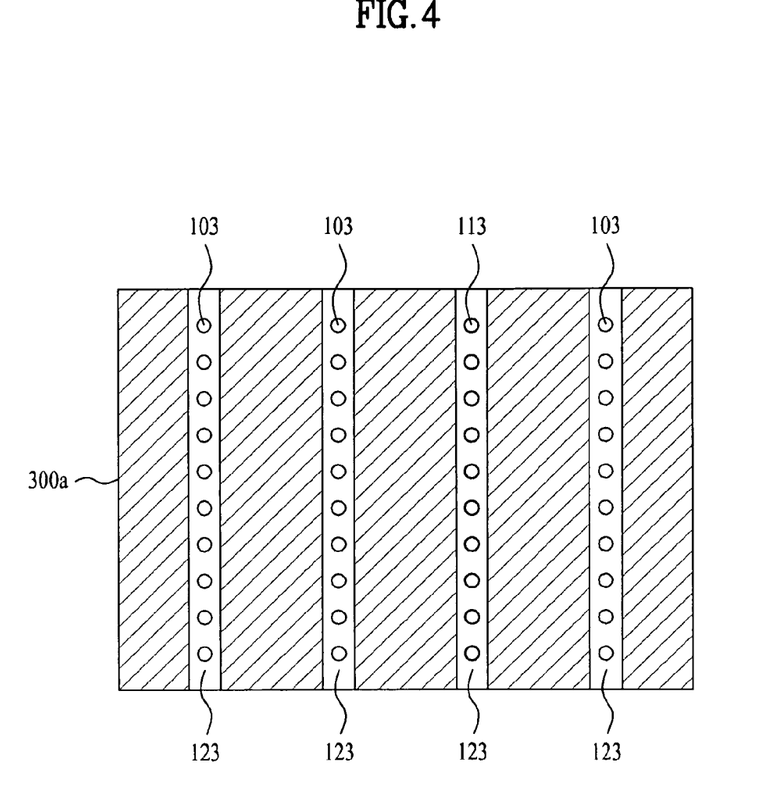
FIG. 4 illustrates a back side view of the upper foreign matter washing unit in FIG. 2.

FIG. 3 illustrates a perspective view of the washing unit in FIG. 1, and FIG. 4 illustrates a back side view of the upper foreign matter washing unit 300a in FIG. 3. Referring to FIGS. 1, 3 and 4, the foreign matter washing unit 300 includes an upper foreign matter washing unit 300a and a lower foreign matter washing unit 300b facing each other. The upper foreign matter washing unit 300a and the lower foreign matter washing unit 300b are spaced a predetermined distance from each other, and a space between the upper foreign matter washing unit 300a and the lower foreign matter washing unit 300b spaced thus is a moving space 36 for the substrate SUB to move.

The upper foreign matter washing unit 300a sprays air toward the moving space 36 and draws in the air sprayed thus. A likely, the lower foreign matter washing unit 300a also sprays air toward the moving space 36 and draws in the air sprayed thus. According to this, the substrate SUB entered in the moving space 36 floats in the space of the moving space 36. That is, the upper foreign matter washing unit 300a sprays the air toward the upper surface of the substrate SUB entered in the moving space 36 and draws in the air sprayed thus, and the lower foreign matter washing unit 300b sprays the air toward the lower surface of the substrate SUB entered in the moving space 36 and draws in the air sprayed thus, maintaining the substrate SUB floated in the moving space 36. In this instance, a spray power is stronger than a drawing in power.

The upper foreign matter washing unit 300a sprays washing liquid toward the moving space 36 to form foam by using the washing liquid and the sprayed air for removing the foreign matters from the upper surface of the substrate SUB passing through the moving space 36, and the lower foreign matter washing unit 300b sprays washing liquid toward the moving space 36 to form foam by using the washing liquid and the sprayed air for removing the foreign matters from the lower surface of the substrate SUB passing through the moving space 36. The upper foreign matter washing unit 300a and the lower foreign matter washing unit 300b remove the washing liquid to an outside of the foreign matter washing unit 300 by using the air drawn therein. The washing liquid may be deionized water, a chemical solution, or a mixture of the deionized water and the chemical solution.

In order to make the air supplied from an outside of the washing device to pass the upper foreign matter washing unit 300a and the lower foreign matter washing unit 300b themselves and to be sprayed toward the substrate SUB, the upper foreign matter washing unit 300a and the lower foreign matter washing unit 300b are formed of the metallic porous material. That is, the air sprayed to an upper side of the upper foreign matter washing unit 300a from the outside of the washing device passes through the upper foreign matter washing unit 300a and is supplied to the moving space 36, and the air sprayed to a lower side of the lower foreign matter washing unit 300b from the outside of the washing device passes through the lower foreign matter washing unit 300b and is supplied to the moving space 36.

The upper foreign matter washing unit 300a and the lower foreign matter washing unit 300b have a plurality of suction holes 103 formed therein for drawing in the air, respectively. The suction holes 103 in the upper foreign matter washing unit 300a pass through the upper foreign matter washing unit 300a and are directed toward the moving space 36, and the suction holes 103 in the lower foreign matter washing unit 300b pass through the lower foreign matter washing unit 300b and are directed toward the moving space 36.

The upper foreign matter washing unit 300a includes a plurality of trenches 123, further. The plurality of suction holes 103 are connected to one of the trenches in common for drawing in the air or the washing liquid through the trench 123 and the plurality of spray holes 113 are connected to another one of the trenches 123 in common for spraying the washing liquid through the trench 123.

The trenches 123 are formed in a direction perpendicular to a direction of movement of the substrate SUB, and arranged in the moving direction of the substrate SUB. The washing liquid is filled in the trenches 123 enabling to enhance a washing effect of the substrate SUB.

A gap between the upper foreign matter washing unit 300a and the substrate SUB is about 20 μm, and a gap between the lower foreign matter washing unit 300b and the substrate SUB is also about 20 μm. The distance between the upper foreign matter washing unit 300a and the lower foreign matter washing unit 300b can be varied with thickness of the substrate SUB.

The position control unit 400 sprays air toward a lower side of the substrate SUB being moving out of the washing device and draws in the air for making the substrate SUB maintained in a floated state. The substrate SUB is moved from the position control unit 400 to the next processing unit by rollers 60.

Figure 5:
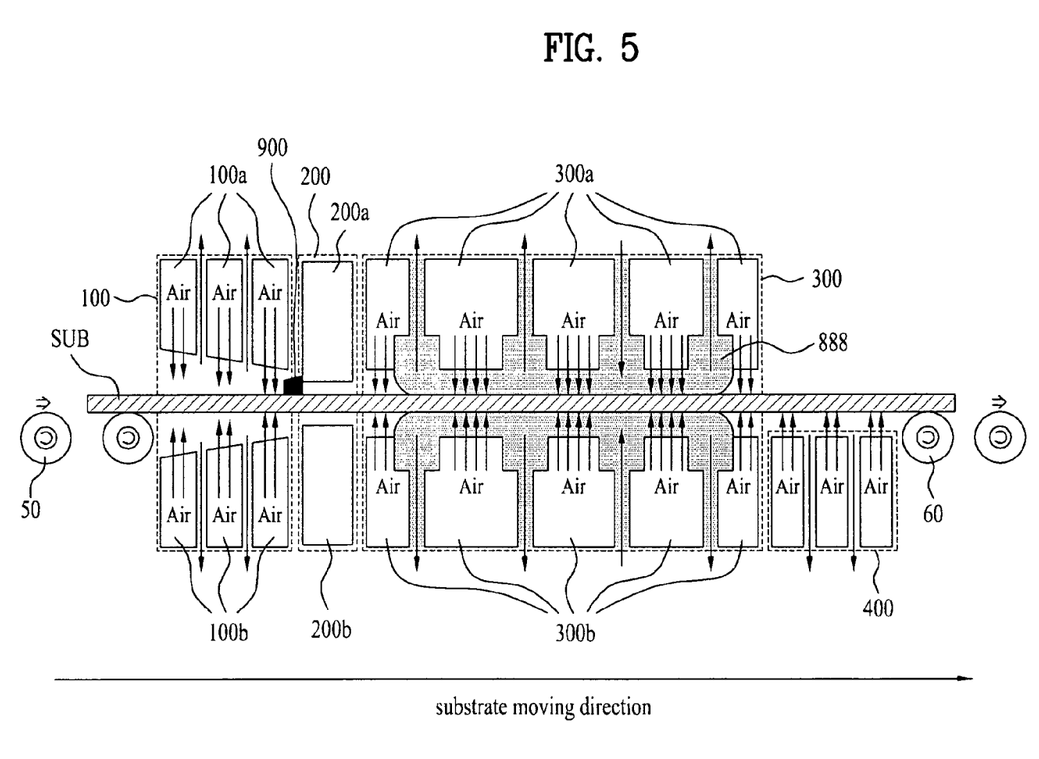
FIG. 5 illustrates a diagram for explaining an effect of removal of foreign matters from a substrate.

FIG. 5 illustrates a diagram for explaining an effect of removal of foreign matters from a substrate.

Referring to FIG. 5, there is a foreign matter 900 on the upper surface of the substrate SUB. Such a fixed type foreign matter 900 is removed as the foreign matter 900 comes into contact with the upper foreign matter removal unit 200a physically. In the meantime, the foreign matters left after removal of the foreign matter 900 or a solidified foreign matter failed to remove with the upper foreign matter removal unit 200a is removed by the foreign matter washing unit 300. That is, a remained foreign matter or the solidified foreign matter is removed by the washing liquid 888 sprayed from the foreign matter washing unit 300 or the foam. The foam is formed as the air is sprayed to the washing liquid 888.

Each of the upper structure 100a, the lower structure 100b, the upper foreign matter removal unit 200a, the lower foreign matter removal unit 200b, the upper foreign matter washing unit 300a, the lower foreign matter washing unit 300b, and the position control unit 400 includes a plurality of elements. Each of the plurality of elements of one unit has a shape identical to the unit it belongs. The elements are connected together to form one unit.

A method for fabricating one element of any one of units of the upper structure 100a, the lower structure 100b, the upper foreign matter removal unit 200a, the lower foreign matter removal unit 200b, the upper foreign matter washing unit 300a, the lower foreign matter washing unit 300b, and the position control unit 400 will be described.

FIGS. 6A~6D illustrate the steps of a method for fabricating one element of a washing device in accordance with a preferred embodiment of the present invention.

Figure 6A:
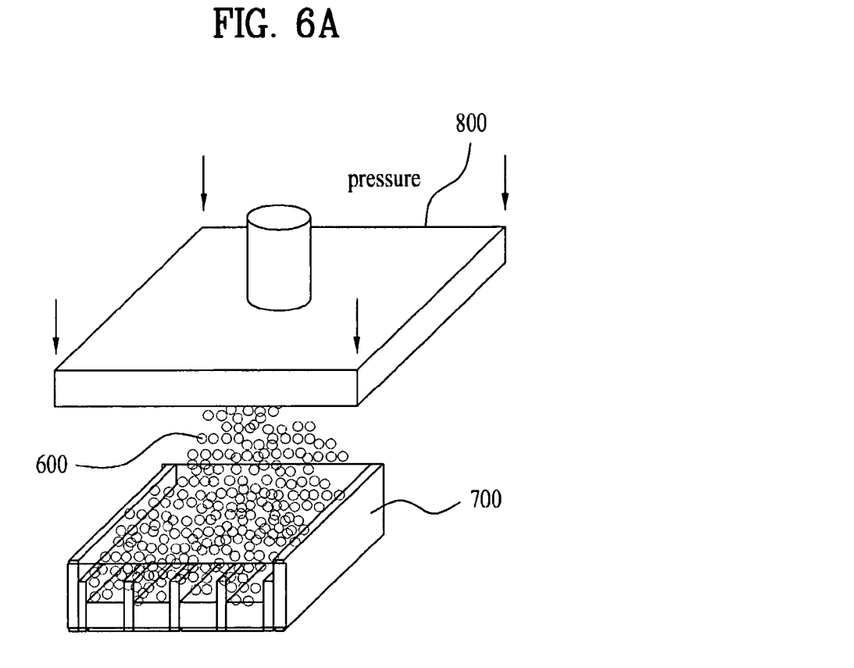
FIGS. 6A~6D illustrate the steps of a method for fabricating one element of a washing device in accordance with a preferred embodiment of the present invention.

Referring to FIG. 6A, a mold 700 of the element 900 is provided, and metal powder 600 is filled in the mold 700. The metal powder 600 may be powder of one selected from stainless steel, aluminum, an aluminum alloy, brass, hastelloy, and zirconium. Then, a pressure is applied to the metal powder 600 in the mold 700 with a press 800.

Figure 6B:
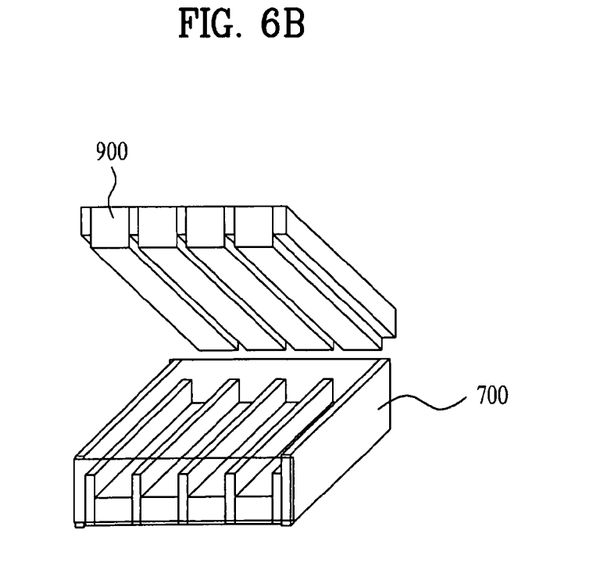

Then, referring to FIG. 6B, the metal powder 600 is molded into the element 900.

Figure 6C:
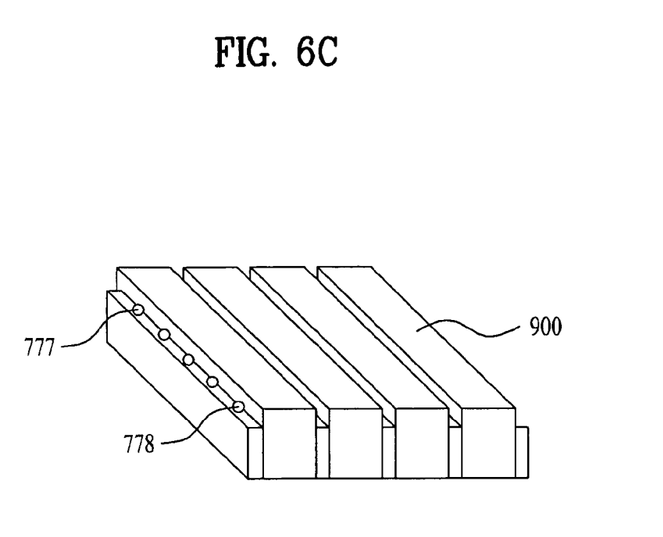

Then, referring to FIG. 6C, a plurality of spray holes 777 and suction holes 778 are formed in the element 900 with a drill.

Then, the steps of FIGS. 6A~6C are repeated, to form a plurality of the elements 900.

Figure 6D:
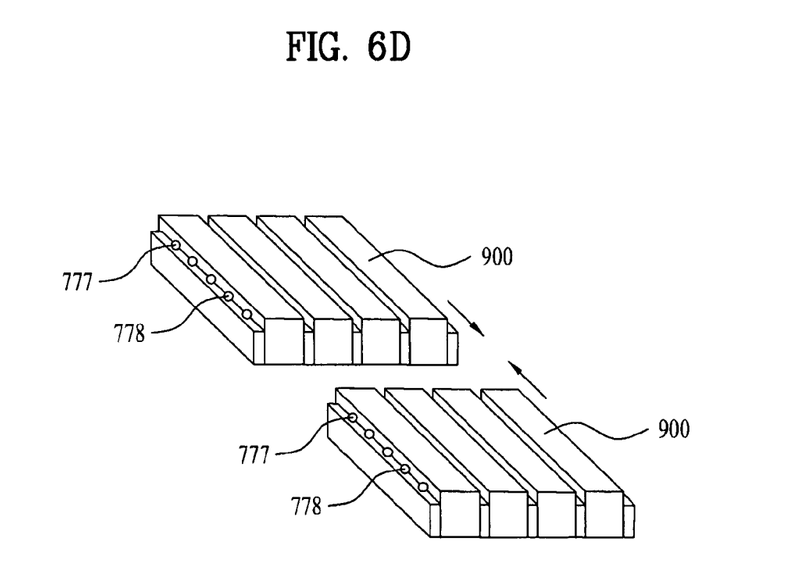

Then, referring to FIG. 6D, a plurality of the elements 900 are connected to each other, to complete fabrication of one unit. In this instance, the plurality of elements 900 may be put together by welding or with screws.

The completed unit is any one of the upper structure 100a, the lower structure 100b, the upper foreign matter removal unit 200a, the lower foreign matter removal unit 200b, the upper foreign matter washing unit 300a, the lower foreign matter washing unit 300b, and the position control unit 400.

As has been described, the washing device and the method for fabricating the same have the following advantages.

The washing device formed of the metallic porous material can enhance chemical resistance.

Along with this, since the metallic porous material has hardness lower than hardness of the washing object intended to wash, i.e., the substrate, the washing device formed of the metallic porous material prevents the substrate suffering from damage even if the substrate and the washing device are come into contact with each other in a washing process.

Since the elements of the units of the washing device is fabricated by using powder metallurgy, clogging of the pores in the steps of the method for fabricating the element can be prevented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A washing device comprising:
   a substrate entry guide for making a substrate to enter in a right direction from an outside of the washing device;
   a foreign matter removal unit for receiving the substrate from the substrate entry guide unit and removing foreign matters from the substrate;
   a foreign matter washing unit for receiving the substrate from the foreign matter removal unit and washing remained foreign matters from the substrate; and
   a position control unit for controlling a position of the substrate moving out of the foreign matter washing unit,
   wherein at least one of the substrate entry guide, the foreign matter removal unit, the foreign matter washing unit, and the position control unit is formed of metallic porous material having a hardness lower than the substrate;
   wherein the foreign matter washing unit includes:
   an upper foreign matter washing unit and a lower foreign matter washing unit facing, and spaced from, each other such that the substrate can pass through,
   wherein the upper foreign matter washing unit sprays air toward the moving space and draws in the air sprayed thus, and the lower foreign matter washing unit sprays air toward the moving space and draws in the air sprayed thus such that the substrate entered in the moving space floats in the space of the moving space,
   wherein the upper foreign matter washing unit sprays washing liquid toward the moving space to form foam by using the washing liquid and the sprayed air for removing the foreign matters from the upper surface of the substrate passing through the moving space,
   wherein the lower foreign matter washing unit sprays washing liquid toward the moving space to form foam by using the washing liquid and the sprayed air for removing the foreign matters from the lower surface of the substrate passing through the moving space, and
   wherein the upper foreign matter washing unit and the lower foreign matter washing unit remove the washing liquid to an outside of the foreign matter washing unit by using the air drawn therein;
   wherein the substrate entry guide is formed of stainless steel, the foreign matter removal unit is formed of aluminum, the foreign matter washing unit is formed of aluminum, and the position control unit is formed of brass;
   wherein a gap between the upper foreign matter washing unit and the substrate is 20 μm, and a gap between the lower foreign matter washing unit and the substrate is 20 μm;
   wherein the upper foreign matter washing unit and the lower foreign matter washing unit are formed of metallic porous material having a hardness lower than the substrate such that the air supplied from an outside of the washing device passes through the upper foreign matter washing unit and the lower foreign matter washing unit themselves and is sprayed to the moving space;
   wherein the upper foreign matter washing unit and the lower foreign matter washing unit includes a plurality of suction holes formed therein for drawing in the air respectively, a plurality of spray holes for spraying the washing liquid respectively, and a plurality of trenches;
   wherein the suction holes and spray holes in the upper foreign matter washing unit pass through the upper foreign matter washing unit and are directed toward the moving space, and
   the suction holes and spray holes in the lower foreign matter washing unit pass through the lower foreign matter washing unit and are directed toward the moving space;

wherein the plurality of suction holes are connected to one of the trenches in common for drawing in the air or the washing liquid through the trench;

wherein the plurality of spray holes are connected to another one of the trenches in common for spraying the washing liquid through the trench;

wherein the trenches are formed in a direction perpendicular to a direction of movement of the substrate;

wherein the foreign matter removal unit includes:

an upper foreign matter removal unit and a lower foreign matter removal unit facing, and spaced from, each other, such that the substrate can pass, wherein the upper foreign matter removal unit removes the foreign matters from the upper surface of the substrate by making physical contact with the foreign matters, and the lower foreign matter removal unit removes the foreign matters from the lower surface of the substrate by making physical contact with the foreign matters, wherein there exists a gap between the upper foreign matter removal unit and the substrate, and there exists a gap between the lower foreign matter removal unit and the substrate, and wherein the upper foreign matter removal unit and the lower foreign matter removal unit vibrate;

wherein the upper foreign matter removal unit moves up/down over the substrate to an extent not to contact to the upper surface of the substrate repeatedly, and the lower foreign matter removal unit moves up/down under the substrate to an extent not to contact to the lower surface of the substrate repeatedly;

wherein the upper and lower foreign matter removal units move up/down to an extent that they are closer to the substrate than the foreign matter washing unit.

2. The washing device as claimed in claim 1, wherein the substrate entry guide includes an entry guide path for guiding the substrate to enter from an outside of the washing device into the foreign matter removal unit accurately, and the entry guide path has a shape in which a width thereof becomes the smaller as the entry guide path is the closer to the foreign matter removal unit.

3. The washing device as claimed in claim 2, wherein the substrate entry guide unit includes;

an upper structure and a lower structure facing, and spaced from, each other to form the entry guide path, wherein the upper structure sprays air toward the entry guide path and draws in the air sprayed thus and the lower structure also sprays air toward the entry guide path and draws in the air sprayed thus so that the substrate entered in the entry guide path floats in the space of the entry guide path, of two facing surfaces of the upper structure and the lower structure, a surface of the upper structure is sloped with respect to an upper surface of the substrate, and a surface of the lower structure is sloped with respect to a lower surface of the substrate, and a space between the two sloped surfaces is the entry guide path.

4. The washing device as claimed in claim 3, wherein the upper structure and the lower structure are formed of metallic porous material having a hardness lower than the substrate such that the air supplied from an outside of the washing device passes through the upper structure and the lower structure themselves and is sprayed to the substrate.

5. The washing device as claimed in claim 4, wherein the upper structure and the lower structure have a plurality of air suction holes formed therein for drawing in the air, wherein the suction holes in the upper structure is passed through the upper structure and directed toward the entry guide path, and the suction holes in the lower structure is passed through the lower structure and directed toward the entry guide path.

6. The washing device as claimed in claim 1, wherein the upper foreign matter removal unit and the lower foreign matter removal unit are formed of metal having a hardness lower than the substrate.

7. The washing device as claimed in claim 1, wherein the upper foreign matter removal unit moves in front/rear directions, or left/right directions of the upper surface of the substrate in parallel thereto repeatedly, and the lower foreign matter removal unit moves in front/rear directions, or left/right directions of the lower surface of the substrate in parallel thereto repeatedly.

8. The washing device as claimed in claim 1, wherein the position control unit sprays the air toward an under side of the substrate moving out of the washing device and draws in the air sprayed thus for maintaining the substrate in a floated state.

9. The washing device as claimed in claim 1, wherein the gap between the upper foreign matter removal unit and the substrate is a maximum of 20 μm, and the gap between the lower foreign matter removal unit and the substrate is a maximum of 20 μm.

10. The washing device as claimed in claim 1, wherein the gap between the upper foreign matter removal unit and the substrate is a maximum of 20 μm, and the gap between the lower foreign matter removal unit and the substrate is a maximum of 20 μm.

11. A washing device comprising:

a substrate entry guide for making a substrate to enter in a right direction from an outside of the washing device;

a foreign matter removal unit for receiving the substrate from the substrate entry guide unit and removing foreign matters from the substrate;

a foreign matter washing unit for receiving the substrate from the foreign matter removal unit and washing remained foreign matters from the substrate; and a position control unit for controlling a position of the substrate moving out of the foreign matter washing unit, wherein at least one of the substrate entry guide, the foreign matter removal unit, the foreign matter washing unit, and the position control unit is formed of metallic porous material having a hardness lower than the substrate;

wherein the foreign matter washing unit includes:

an upper foreign matter washing unit and a lower foreign matter washing unit facing, and spaced from, each other such that the substrate can pass through, wherein the upper foreign matter washing unit sprays air toward the moving space and draws in the air sprayed thus, and the lower foreign matter washing unit sprays air toward the moving space and draws in the air sprayed thus such that the substrate entered in the moving space floats in the space of the moving space, wherein the upper foreign matter washing unit sprays washing liquid toward the moving space to form foam by using the washing liquid and the sprayed air for removing the foreign matters from the upper surface of the substrate passing through the moving space, wherein the lower foreign matter washing unit sprays washing liquid toward the moving space to form foam by using the washing liquid and the sprayed air for removing the foreign matters from the lower surface of the substrate passing through the moving space, and wherein the upper foreign matter washing unit and the lower foreign matter washing unit remove the washing liquid to an outside of the foreign matter washing unit by using the air drawn therein;

wherein a gap between the upper foreign matter washing unit and the substrate is 20 μm, and a gap between the lower foreign matter washing unit and the substrate is 20μm;

wherein the upper foreign matter washing unit and the lower foreign matter washing unit are formed of metallic porous material having a hardness lower than the substrate such that the air supplied from an outside of the washing device passes through the upper foreign matter washing unit and the lower foreign matter washing unit themselves and is sprayed to the moving space;

wherein the upper foreign matter washing unit and the lower foreign matter washing unit includes a plurality of suction holes formed therein for drawing in the air respectively, a plurality of spray holes for spraying the washing liquid respectively, and a plurality of trenches;

wherein the suction holes and spray holes in the upper foreign matter washing unit pass through the upper foreign matter washing unit and are directed toward the moving space, and the suction holes and spray holes in the lower foreign matter washing unit pass through the lower foreign matter washing unit and are directed toward the moving space;

wherein the plurality of suction holes are connected to one of the trenches in common for drawing in the air or the washing liquid through the trench;

wherein the plurality of spray holes are connected to another one of the trenches in common for spraying the washing liquid through the trench;

wherein the trenches are formed in a direction perpendicular to a direction of movement of the substrate;

wherein the substrate entry guide, the foreign matter removal unit, and the foreign matter washing unit are formed of a porous material of one of metals selected from brass and zirconium;

wherein the foreign matter removal unit includes:
an upper foreign matter removal unit and a lower foreign matter removal unit facing, and spaced from, each other, such that the substrate can pass,
wherein the upper foreign matter removal unit removes the foreign matters from the upper surface of the substrate by making physical contact with the foreign matters, and the lower foreign matter removal unit removes the foreign matters from the lower surface of the substrate by making physical contact with the foreign matters,
wherein there exists a gap between the upper foreign matter removal unit and the substrate, and there exists a gap between the lower foreign matter removal unit and the substrate, and
wherein the upper foreign matter removal unit and the lower foreign matter removal unit vibrate;

wherein the upper foreign matter removal unit moves up/down over the substrate to an extent not to contact to the upper surface of the substrate repeatedly, and the lower foreign matter removal unit moves up/down under the substrate to an extent not to contact to the lower surface of the substrate repeatedly;

wherein the upper and lower foreign matter removal units move up/down to an extent that they are closer to the substrate than the foreign matter washing unit.

* * * * *